United States Patent
Sandhu

(10) Patent No.: US 6,462,313 B1
(45) Date of Patent: Oct. 8, 2002

(54) METHOD AND APPARATUS TO CONTROL TEMPERATURE IN AN RTP SYSTEM

(75) Inventor: Gurtej Sandhu, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/785,447

(22) Filed: Feb. 20, 2001

(51) Int. Cl.⁷ .................................................. H05B 1/02
(52) U.S. Cl. .................. 219/497; 219/121.43; 438/663; 392/416
(58) Field of Search ................................. 219/497, 501, 219/486, 499, 121.43, 121.41; 118/724, 725; 438/663, 715; 392/416

(56) References Cited

U.S. PATENT DOCUMENTS

| | | | | |
|---|---|---|---|---|
| 5,790,750 A | * | 8/1998 | Anderson | 392/416 |
| 5,954,982 A | * | 9/1999 | Sogard | 219/502 |
| 6,046,439 A | | 4/2000 | Johnsgard et al. | |
| 6,184,498 B1 | * | 2/2001 | Kiyama | 219/390 |
| 6,222,164 B1 | * | 4/2001 | Stoddard et al. | 219/497 |
| 6,307,184 B1 | * | 10/2001 | Womack et al. | 219/390 |

* cited by examiner

*Primary Examiner*—Mark Paschall
(74) *Attorney, Agent, or Firm*—Dickstein Shapiro Morin & Oshinsky, LLP

(57) ABSTRACT

An apparatus and method is provided for rapid thermal processing (RTP) of semiconductor wafers that compensates for variations in heat absorption characteristics of the wafers. Wafer-to-wafer temperature variation is substantially eliminated using a model of the heat absorption characteristics of different wafer types to predict a steady state temperature of a wafer undergoing processing. This prediction is used to detect potential variations in wafer temperature during the RTP process and correct for these variations by adjusting the output of the heat source.

46 Claims, 5 Drawing Sheets

METHOD AND APPARATUS TO CONTROL TEMPERATURE IN AN RTP SYSTEM

FIELD OF THE INVENTION

The present invention relates to semiconductor manufacturing, and in particular, to a method and apparatus to control temperature in a rapid thermal processing (RTP) system.

BACKGROUND OF THE INVENTION

One of the procedures commonly used during the manufacture of semiconductor devices is rapid thermal processing (RTP), for example for annealing of a semiconductor wafer. Several different RTP methods have been proposed, including those utilizing a variety of sources of heat, such as arc-lamps and heating blocks.

Because variations in wafer temperature during the annealing process can lead to yield problems in the resulting semiconductor devices, temperature is sought to be closely controlled and monitored during the RTP process. For example, the wafer is sought to be heated to a specified temperature for a specified time period, and the temperature conditions should not change from wafer to wafer. The specified times and temperatures often vary for the several different heating steps of a typical semiconductor production process.

Semiconductor manufacturers thus are continually in search of methods to ensure precise control of wafer temperature during annealing. Conventional RTP systems typically employ a combination of techniques for controlling temperature, including specialized heat sources, reflective or absorptive heating chambers, and wafer rotation.

A problem may arise in that the temperature of each wafer undergoing processing depends on the heat absorption characteristics of the wafer, which may vary significantly from wafer to wafer depending on the wafer type, films added to the wafer, and emissivity of the wafer surface. In addition, it is often difficult to directly measure the temperature of the wafer undergoing heating, due to the presence of various films and layers on the wafer and the desire to avoid invasive measurement methods. Thus, monitoring and control of wafer temperature presents a difficult problem.

One popular RTP system employs a heating block or "susceptor" of nearly constant temperature that is placed adjacent a wafer undergoing annealing. The temperature of the susceptor is closely monitored and controlled, and temperature variations in the wafer may be determined from temperature variations in the susceptor. This system offers several advantages over lamp-based systems, in that the wafer heating profile is less dependent upon wafer surface characteristics, e.g. backside films.

Temperature may be tightly controlled using such a susceptor-based system, yet wafer-to-wafer temperature variations may continue to occur. When a wafer is initially placed adjacent the susceptor, the temperature of the susceptor drops as heat is initially transferred to the wafer. Over time, the wafer heats up and the temperature of the susceptor, as well as the wafer, returns to a steady-state temperature.

During the initial heating of each wafer, the heat absorption characteristics of the wafer determine the rate of drop of the susceptor temperature and rate of increase of the wafer temperature. When a series of wafers is successively heated using this RTP system and each wafer has different heat absorption characteristics, wafer-to-wafer temperature variations may occur. As noted, this successive wafer-to-wafer temperature variation may result in possible yield problems for the produced semiconductor devices.

Accordingly, there is a strong desire and need to produce an RTP method that substantially eliminates wafer-to-wafer temperature variations for annealing of wafers having varying heat absorption characteristics.

SUMMARY OF THE INVENTION

An apparatus and method for rapid thermal processing (RTP) of semiconductor wafers is provided that compensates for variations in heat absorption characteristics of the wafers. The invention nearly eliminates wafer-to-wafer temperature variation by using a model of the heat absorption characteristics of different wafer types to predict a steady state temperature of a wafer undergoing processing. This prediction is used to detect potential variations in wafer temperature during the RTP process and correct for these variations by adjusting the output of the heat source.

In an exemplary embodiment of the invention, the rate at which the temperature of the heating block, or susceptor, changes when the wafer is initially placed in the heating chamber is measured and this measurement is used in the prediction of the steady-state temperature of the wafer. Heating values of the susceptor may be adjusted to achieve a desired steady-state wafer temperature. Measurements and adjustments may be stored and used to update the model of wafer heat absorption characteristics for later processing of wafers.

BRIEF DESCRIPTION OF THE DRAWINGS

The above and other advantages and features of the invention will be more clearly understood from the following detailed description of the invention which is provided in connection with the accompanying drawings in which.

DETAILED DESCRIPTION OF THE PREFERRED EMBODIMENTS

Figure 1:
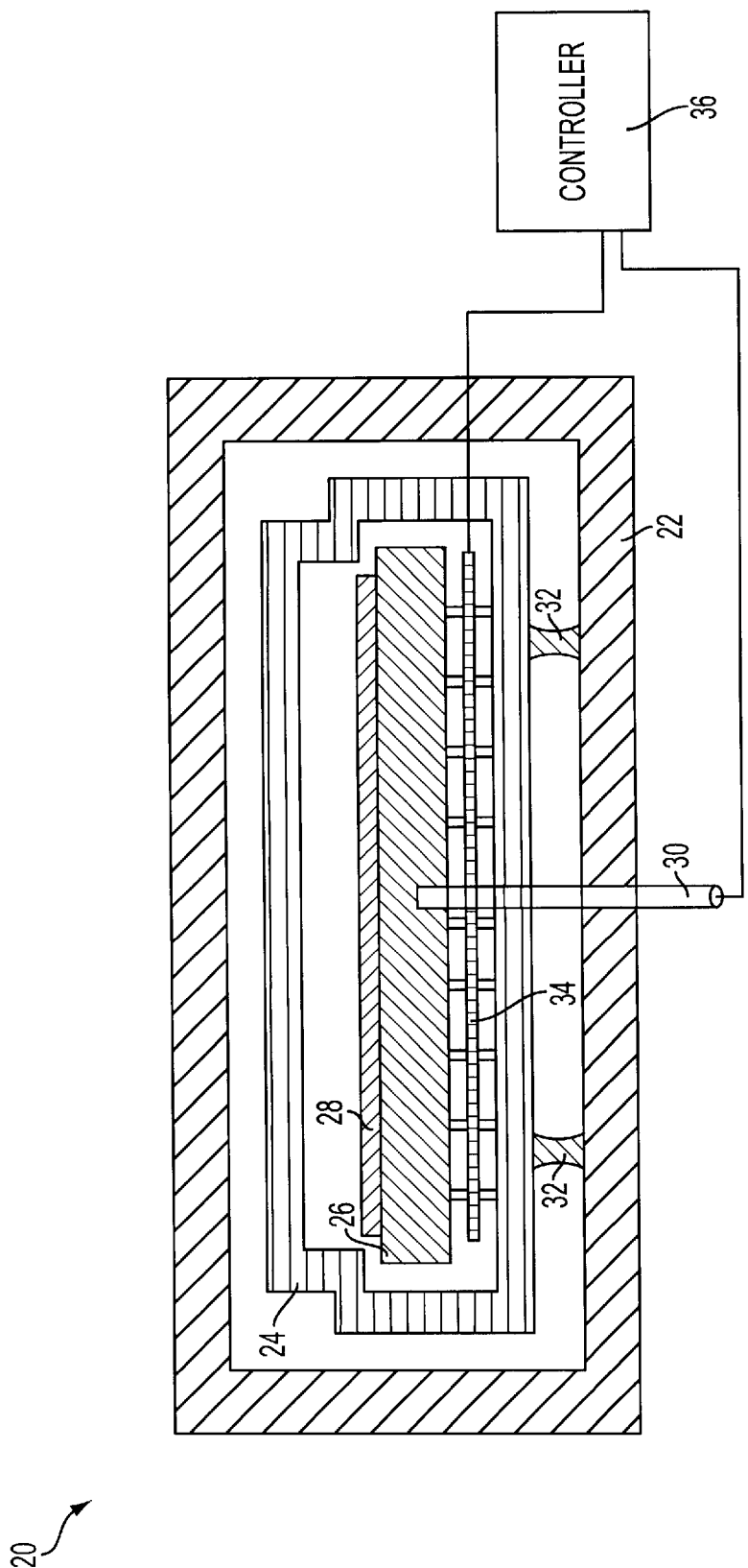
FIG. 1 illustrates a cross-sectional view of an apparatus for rapid thermal processing (RTP) in accordance with an exemplary embodiment of the invention.

FIG. 1 shows an exemplary heating chamber 20 for rapid thermal processing (RTP) of a semiconductor wafer 28 in accordance with the invention. A wafer 28 undergoing processing is placed adjacent a susceptor 26 which supplies heat to the wafer 28. The susceptor 26 is itself heated by a resistive heater 34 which is controlled by an external controller 36. The temperature of the susceptor 26 may be monitored using a thermocouple or optical pyrometer 30. An inner insulated wall 24 and an outer insulated wall 22 enclose the wafer 28, susceptor 26 and resistive heater 34, in order to maintain a nearly isothermal environment inside the heating chamber.

In operation, the inside of the heating chamber 20 is maintained at a nearly constant temperature. A series of wafers is heated in succession inside the heating chamber 20, whereby each wafer 28 is initially placed adjacent the susceptor 26, the temperature stabilizes at a steady state value, and the wafer 28 is removed from the heating chamber 20 after a specified period of time.

Figure 2:
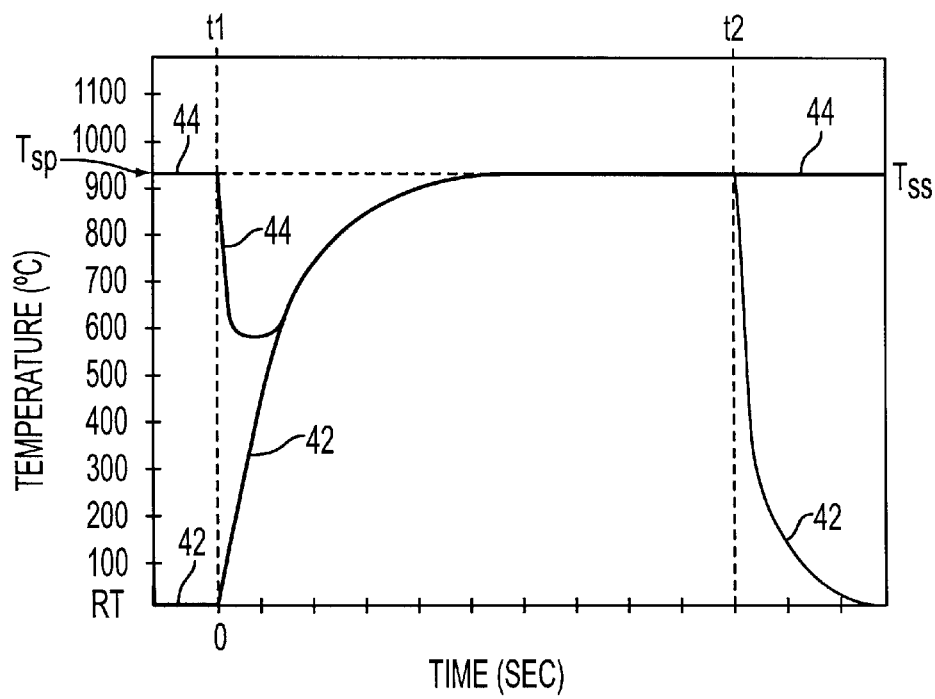
FIG. 2 illustrates a graph of temperature vs. time for the wafer and the susceptor shown in FIG. 1.

FIG. 2 illustrates exemplary temperature profiles 42, 44 of the wafer 28 and the susceptor 26, respectively, during the RTP process. At time t1, the wafer 28 is placed adjacent the susceptor 26, and at time t2, the wafer 28 is removed from the heating chamber 20. The temperature profile 42 of the wafer 28 over time reflects this RTP heating process. At time t1, the wafer 28 is heated, eventually reaching the steady-state temperature Tss. At time t2, the wafer 28 is removed and its temperature eventually decreases to room temperature.

During the time when the temperature of the wafer 28 is ramping up, but before the temperature reaches the steady-state value Tss, the temperature of the wafer 28 varies with the susceptor temperature according to the relation:

$$Twafer \sim Tsusceptor * (1 - e^{-t/\tau})$$

where $\tau$ is a time constant that is characteristic of the wafer 28, Twafer is the temperature of the wafer 28, Tsusceptor is the temperature of the susceptor 26, and t is time. This relationship shows that the temperature of the wafer 28 during heating is directly proportional to the temperature of the susceptor 26, and any variations in the temperature of the susceptor 26 indicate a proportional variation in the temperature of the wafer 28.

Referring to FIG. 2, the profile 44 of the susceptor 26 shows that the temperature of the susceptor 26 drops as the wafer 28 initially heats up. The temperature of the susceptor 26 is initially at the set point temperature Tsp. When the wafer 28 is placed in the heating chamber 20 adjacent the susceptor 26, the temperature of the wafer 28 increases and the temperature of the susceptor 26 drops. The rate of drop in the temperature of the susceptor 26 as well as the ramp rate of the temperature of the wafer 28 depend on the heat absorption characteristics of the wafer 28. The profile 44 shows that, as the wafer 28 continues to heat up, the temperature of the susceptor 26 stops dropping and heats up with the wafer 28. The susceptor 26 eventually reaches the steady-state temperature Tss.

As noted, the temperature of the wafer 28 may be described in terms of the temperature of the susceptor 26 during the ramp up of the temperature of the wafer 28. The temperature profile 44 of the susceptor 26 is measured and recorded, and using the profile 44, the temperature profile 42 of the wafer 28 may be predicted using the relation given above. Thus, the steady state temperature Tss may also be predicted.

In accordance with the invention, each wafer 28 of a series of wafers is successively heated in the heating chamber 20. The controller 26 measures the temperature of the susceptor 26 periodically during the heating period and develops a temperature profile of the susceptor 26 over time for the series of wafers.

In addition, the temperature profiles 42, 44 of the susceptor 26 and the wafer 28, respectively, may be used to determine a mathematical model of the heating behavior of the susceptor 26 and the wafer 28. The mathematical model consists of stored parameters characteristic of a particular type of wafer 28, including, for example, values of the heating time constant, heating temperature profiles for several different set point temperatures, etc. The mathematical model parametrically describes the heating behavior of several different types of wafers that are heated in the heating chamber 20. Using the parameters of the mathematical model, the temperature profile 42, and hence the steady state temperature Tss, of a typical wafer 28 undergoing processing may be predicted.

Figure 3:
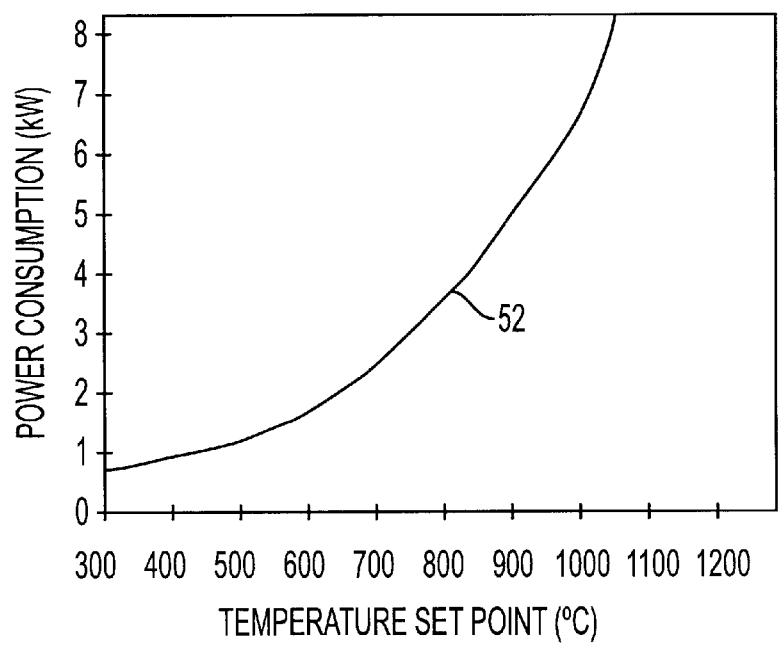
FIG. 3 illustrates a power consumption profile for the exemplary RTP apparatus shown in FIG. 1.

FIG. 3 illustrates the amount of power consumed for a given set point temperature Tsp. Set point temperature Tsp indicates the heating value provided by the resistive heater 34 and the susceptor 26, and may be adjusted by a controller 36 (FIG. 1) in accordance with the invention. The power profile 52 shows that as Tsp increases, the amount of power consumed also increases. At higher Tsp, even small changes in the set point temperature Tsp may result in large changes in power consumption. By employing the processing methodologies of the invention, the controller 36 may adjust power consumption by anticipating and efficiently adjusting for the heat absorption behavior of differing wafer types. Other means of heating the susceptor may be used in accordance with the invention, such as by lamps, laser or microwave energy. A relationship between power and set point temperature Tsp, similar to that shown in FIG. 3, may be determined for each means of heating.

Adjustments to the set point temperature Tsp may be made by the controller 36 in accordance with the invention. The set point temperature Tsp may be adjusted in order to achieve a desired steady state temperature Tss of the wafer 28. One way in which the invention may achieve the desired Tss is via adjustment of the set point temperature Tsp during the initial heating of the wafer. Using the thermocouple or optical pyrometer 30, the controller can measure the temperature and/or the rate of change of temperature of the susceptor 26. When the wafer 28 is initially heated, the temperature of the susceptor 26 changes as noted, and the rate of change of temperature of the susceptor 26 may be measured and used by the controller 36, in conjunction with the mathematical model of heating behavior noted above, to predict the eventual steady state temperature for the current set point temperature. Using the predicted steady state temperature, the controller 36 may perform an "in-situ" adjustment of the set point temperature Tsp as illustrated in FIG. 4.

Figure 4:
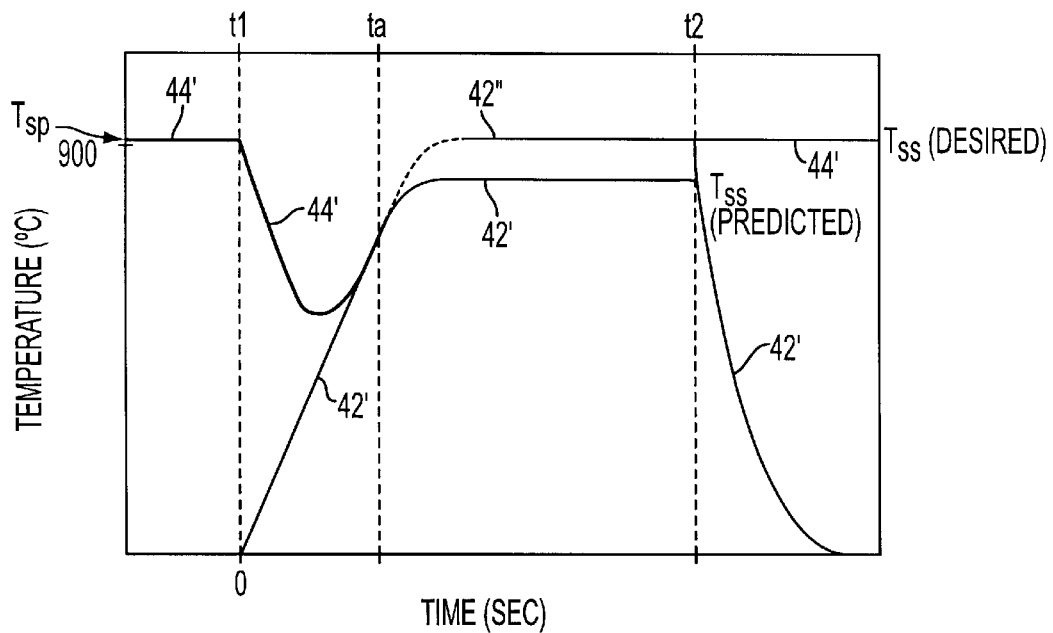
FIG. 4 illustrates a graph of temperature vs. time demonstrating in-situ temperature correction using the apparatus of FIG. 1.

FIG. 4 illustrates an exemplary "in-situ" adjustment of the set point temperature by the controller 36 to achieve a desired steady state temperature Tss in accordance with the invention. Referring to FIG. 4, the wafer 28 is placed adjacent the susceptor 26 at time t1 and removed at time t2. Between t1 and t2, the wafer 28 should be heated to the desired steady state temperature Tss (desired) as shown by the temperature profile 42", and then cools after removal at time t2. During the time period between t1 and ta, the controller 36 is able to assess the temperature profile 44', e.g., the rate of change of temperature of the susceptor 26 (this rate of change of temperature is represented by the slope of the curve 44').

From the assessed temperature profile 44' between t1 and ta, the controller 36 may predict, in conjunction with the mathematical model, the steady state temperature that would result if the current heating value were to remain constant. If the predicted value of the steady state temperature is within an acceptable tolerance of the desired steady state temperature Tss, then no adjustments of the heating value may need to be made by the controller 36. Otherwise, the controller 36 may adjust the heating value of the resistive heater 34 until the predicted value of the steady temperature comes within an acceptable tolerance of the desired value.

In the exemplary profile of FIG. 4, the initial temperature profile 44' between t1 and ta indicates that the wafer 28 would achieve the predicted steady state temperature Tss (predicted) 42' if the current heating value were to remain constant. The controller 36 uses the mathematical model and the initial temperature profile 44' to perform an "in-situ" adjustment of the heating value such that the wafer 28 instead achieves the desired steady state temperature Tss (desired) 42".

Another way in which the controller 36 may achieve a desired temperature of the wafer 28 is through adjustment of the set point temperature Tsp between wafer heating cycles. The controller 36 may store temperature and heating information measured throughout the heating cycle of individual wafers, and use the stored information to improve the heating of later-processed wafers.

Figure 5:
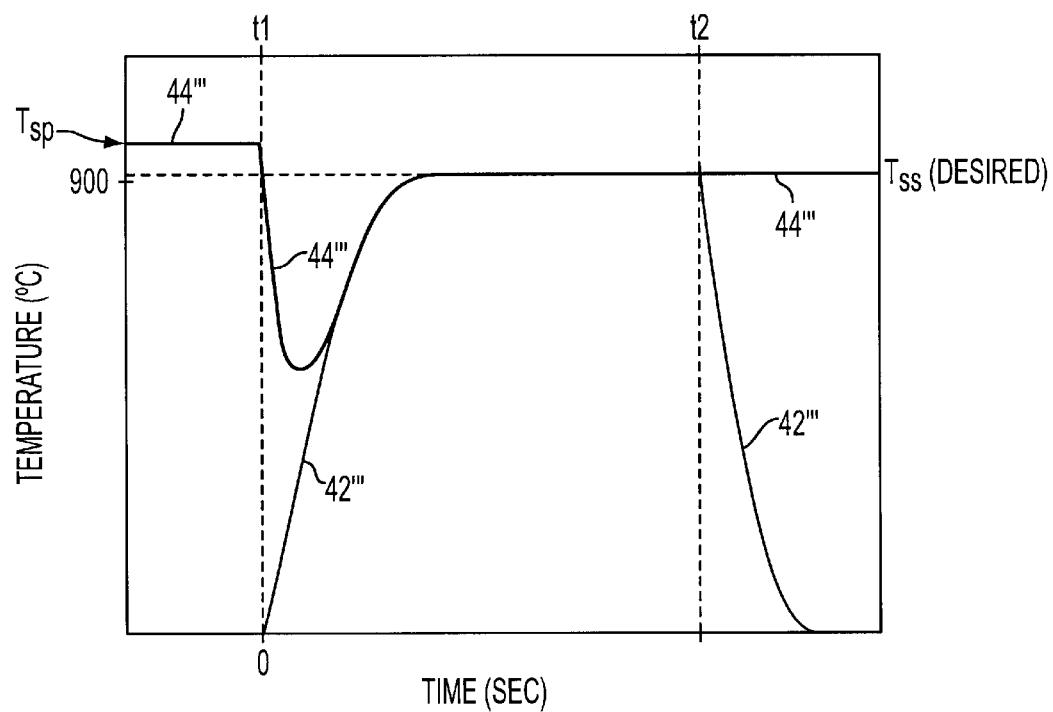
FIG. 5 illustrates a graph of temperature vs. time demonstrating wafer-to-wafer temperature correction using the apparatus of FIG. 1.

For example, FIG. 5 shows exemplary temperature profiles 42''', 44''' of a wafer 28 and susceptor 26, respectively, after an adjustment between heating cycles. To account for a variation in heat absorption characteristics between first and second wafers, the set point temperature Tsp may be adjusted by the controller 36. In accordance with the invention, the controller 36 may be notified of a change in wafer heat absorption characteristics required for the next heating cycle, and the controller 36 may adjust the set point temperature accordingly. As a result, the susceptor 26 may follow the temperature profile 44''', whereby the wafer 28 ramps up to a steady state temperature Tss (desired) as shown. The wafer 28 is placed adjacent the susceptor 26 at time t1 and removed at time t2. Between t1 and t2, the wafer 28 is heated to the desired steady state temperature Tss (desired) as shown by the temperature profile 42''', and then cools after removal at time t2.

Figure 6:
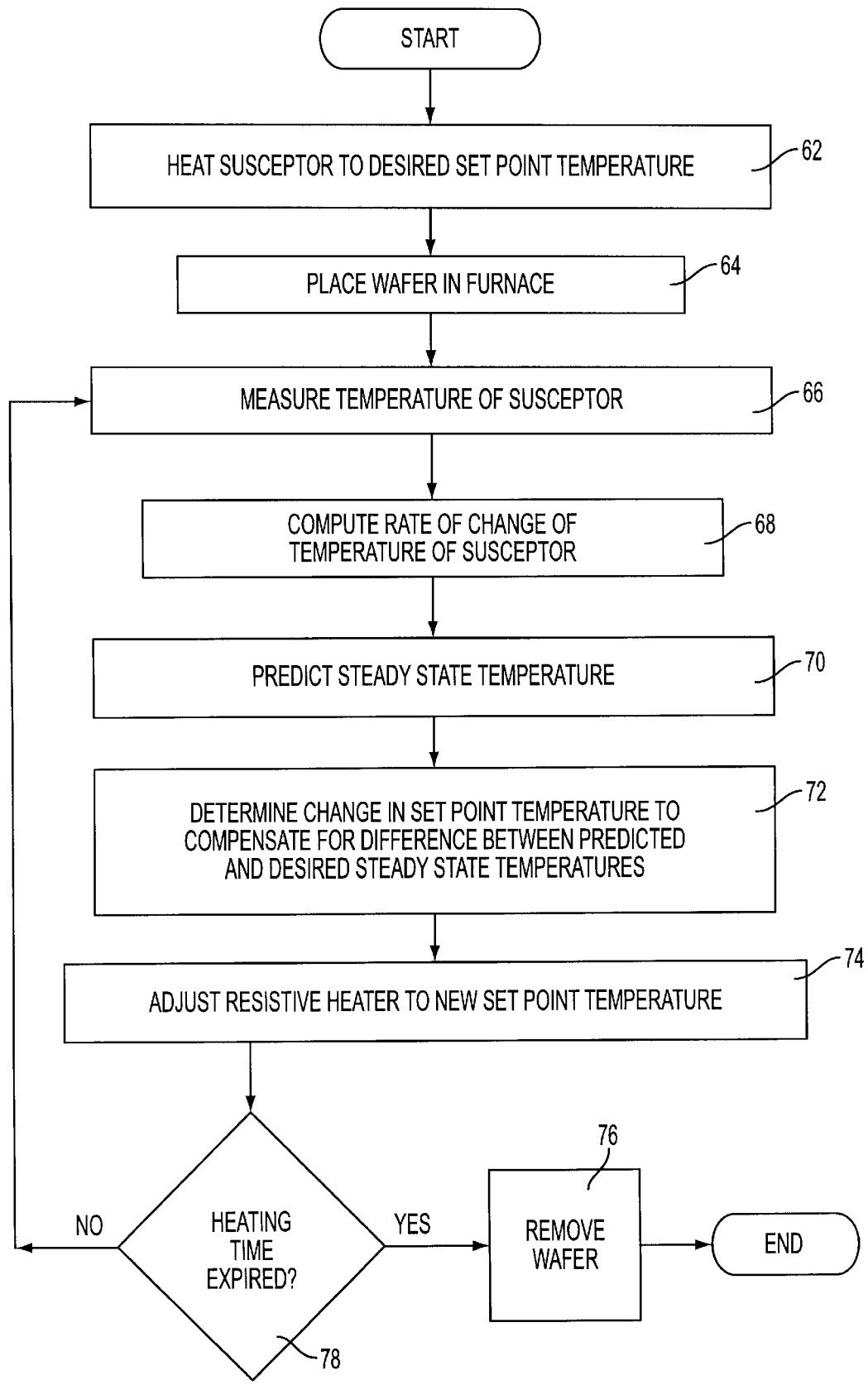
FIG. 6 illustrates the steps of an exemplary embodiment of the method of the invention.

FIG. 6 illustrates an exemplary embodiment of the method of the invention, showing how an exemplary controller 36 (FIG. 1) may achieve a desired steady state temperature Tss using both "in situ" set point adjustments and adjustments between wafer heating cycles. The wafer heating cycle begins by heating the susceptor 26 to the set point temperature Tsp using resistive heater 34 (method segment 62). If the previous wafer exhibited different heat absorption characteristics from the next wafer, then the controller 36 may make an adjustment to the set point temperature Tsp at this point. The wafer 28 is placed adjacent the susceptor 28 (method segment 64), and the wafer 28 is heated. As the water 28 is heated, the temperature of the susceptor 26 is repeatedly measured (method segment 66). Using the repeated temperature measurements, the rate of change of susceptor temperature may be determined (method segment 68). This rate may be used as noted, in conjunction with the mathematical model of wafer heating behavior, to predict a temperature profile of the wafer, including the steady state temperature that would result if the heating value were to remain constant (method segment 70). From the difference between the predicted and desired values of steady state temperature, a change in set point temperature Tsp may be determined (method segment 72). The controller 36 may then adjust the set point temperature Tsp to achieve the desired steady state temperature of the wafer 28 (method segment 74). The method flow may then return to method segment 66 to repeat the segments of measuring, predicting and adjusting, until the wafer 28 has been heated at the desired steady state temperature for the desired period of time (method segment 78). The wafer 28 is then removed (method segment 76).

Figure 7:
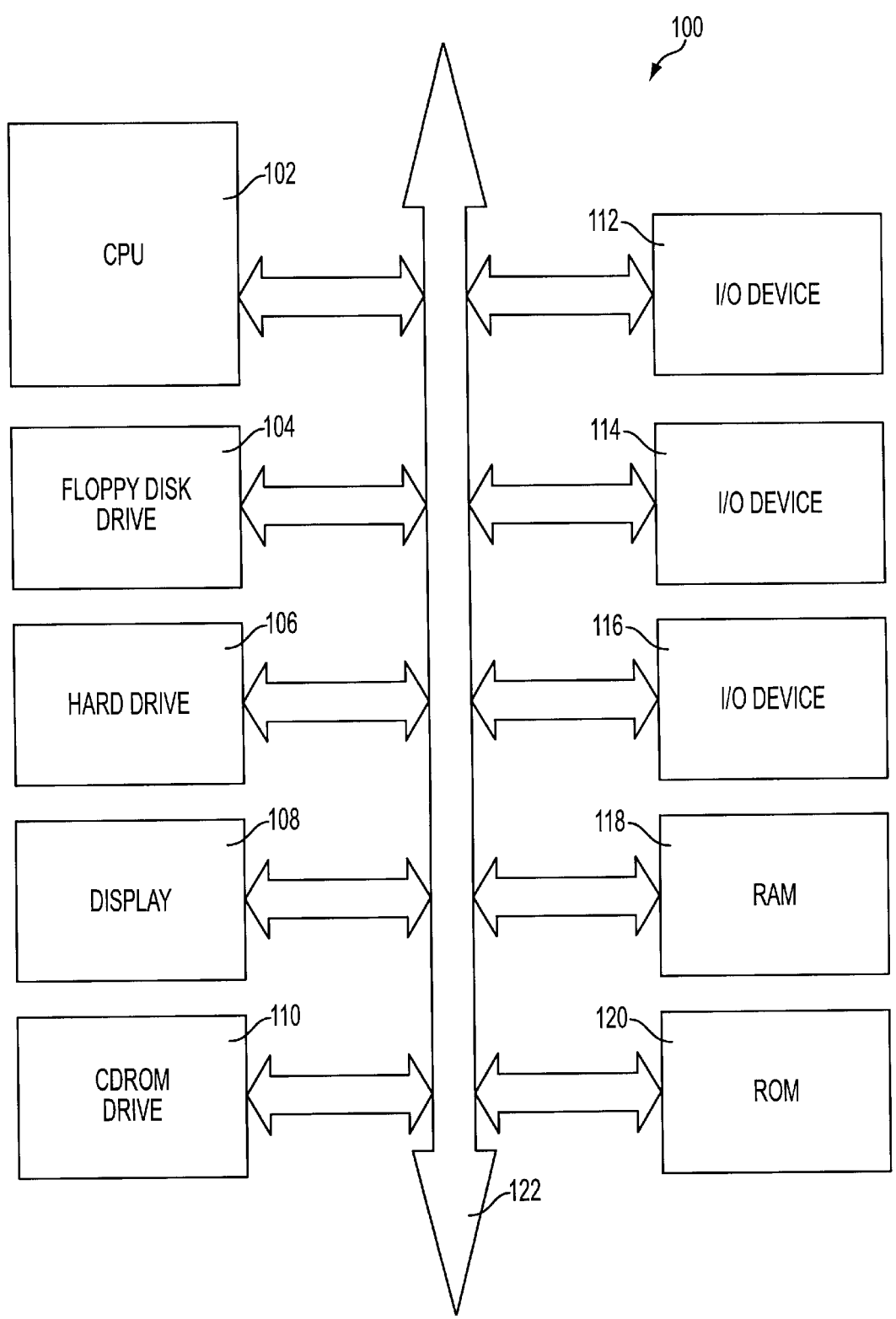
FIG. 7 illustrates an exemplary controller for an RTP apparatus including a processor which employs temperature monitoring and heat source adjustment methodologies in accordance with the invention.

FIG. 7 illustrates an exemplary processor system that may be connected to or included in the controller 36 in accordance with the invention. Referring to FIG. 7, the processor system, which may be a computer system 100, for example, generally comprises a central processing unit (CPU) 102, for example, a microprocessor, that communicates with one or more input/output (I/O) devices 112, 114, 116 over a system bus 122. The input/output devices 112, 114, 116 may include connections to the resistive heater 34 and the thermocouple or optical pyrometer 30. The computer system 100 also includes random access memory (RAM) 118, a read only memory (ROM) 120 and may also include peripheral devices such as a floppy disk drive 104, a hard drive 106, a display 108 and a compact disk (CD) ROM drive 110 which also communicate with the processor 102 over the bus 122. The mathematical model of the heat absorption characteristics of the wafers may be stored and/or accessed using any or all of these peripheral devices 104, 106, 110, 118, 120. In conjunction with the input/output devices 112, 114, 116, e.g., the thermocouple or optical pyrometer 30 and the resistive heater 34, the processor 102 may implement the algorithms and processing methodologies described above with reference to FIGS. 1–6. It should be noted that FIG. 7 is merely representative of one of many different types of architectures of the controller 36 which may employ the invention.

While the invention has been described and illustrated with reference to specific exemplary embodiments, it should be understood that many modifications and substitutions can be made without departing from the spirit and scope of the invention. Accordingly, the invention is not to be considered as limited by the foregoing description but is only limited by the scope of the appended claims.

What is claimed as new and desired to be protected by Letters Patent of the United States is:

1. A method to control temperature in an RTP system, comprising:
   determining a desired value of a heating characteristic of a wafer over time;
   measuring an initial heat value of a support for said wafer;
   positioning said wafer on said support and determining at least one actual value of said heating characteristic during heating of said wafer, said determining at least one actual value comprising comparing said initial heat value to a subsequent heat value of said support measured while said wafer is positioned thereon;
   comparing said at least one actual value with said corresponding desired value of said heating characteristic; and
   adjusting a heat source used in heating said wafer such that said actual value of said heating characteristic approximately equals said corresponding desired value of said heating characteristic.

2. A method to control temperature in an RTP system, comprising:
   providing at least one characteristic parameter describing a wafer being heated by a controlled heater, said controlled heater supporting said wafer during said heating;
   measuring at least one value of a temperature parameter of said controlled heater during said heating of said wafer; and
   controlling a heating value of said controlled heater to achieve a desired value of a steady state temperature, said heating value being controlled in accordance with said at least one characteristic parameter and said at least one measured value.

3. A method to control temperature in an RTP system, comprising:
   providing at least one characteristic parameter describing a wafer being heated by a thermal mass, said thermal mass supporting said wafer during said heating;
   measuring at least one value of a temperature parameter of said thermal mass during said heating of said wafer; and
   controlling a heating value of said thermal mass to achieve a desired value of a steady state temperature, said eating value being controlled in accordance with said at least one characteristic parameter and said at least one measured value.

4. A method as in claim 3, wherein said at least one characteristic parameter includes a heat absorption rate of said wafer.

5. A method as in claim 3, wherein said at least one characteristic parameter includes a heat emissivity of said wafer.

6. A method as in claim 3, wherein said at least one characteristic parameter is alike for all wafers having a same structural configuration.

7. A method as in claim 3, wherein said at least one characteristic parameter is different for wafers having different structural configurations.

8. A method as in claim 3, wherein said at least one measured value of said temperature parameter includes a temperature of said thermal mass.

9. A method as in claim 3, wherein said at least one measured value of said temperature parameter includes a rate of change of temperature of said thermal mass.

10. A method as in claim 3, wherein said heating value is a power input to said thermal mass.

11. A method as in claim 3, wherein said heating value is a set point temperature of said thermal mass.

12. A method as in claim 3, wherein said providing of said at least one characteristic parameter includes providing a plurality of temperature attributes comprising a mathematical model of said wafer undergoing heating.

13. A method as in claim 3, wherein said controlling of said heating value includes computing a predicted value of said steady state temperature from said at least one measured value and said at least one characteristic parameter.

14. A method as in claim 13, wherein said controlling of said heating value includes computing a difference between said predicted value and said desired value of said steady state temperature, and using said difference to control said heating value.

15. A method as in claim 3, wherein said acts of measuring and setting are performed during heating of a first wafer to cause said first wafer to be heated to about said desired value of said steady state temperature.

16. A method as in claim 3, wherein said act of measuring is performed during heating of a first wafer, and said act of setting said heating value is performed prior to heating a second wafer, permitting said second wafer to be heated to about said desired value of said steady state temperature.

17. A method to control temperature in an RTP system, comprising:
   setting a heating value of a thermal mass;
   placing a first wafer adjacent said thermal mass to heat said first wafer;
   providing at least one characteristic parameter describing each of said first wafer and a second wafer;
   measuring at least one value of a temperature parameter of said thermal mass during said heating of said first wafer;
   removing said first wafer from adjacent said thermal mass;
   adjusting said heating value of said thermal mass to achieve a desired value of a steady state temperature of said second wafer, said updated heating value being determined from said at least one characteristic parameter and said at least one measured value; and
   placing said second wafer adjacent said thermal mass to heat said second wafer.

18. A method as in claim 17, wherein said at least one characteristic parameter includes a heat absorption rate of said first and second wafers.

19. A method as in claim 17, wherein said at least one characteristic parameter includes a heat emissivity of said first and second wafers.

20. A method as in claim 17, wherein said at least one characteristic parameter is alike for all wafers having a same structural configuration.

21. A method as in claim 17, wherein said at least one characteristic parameter is different for wafers having different structural configurations.

22. A method as in claim 17, wherein said at least one measured value of said temperature parameter includes a temperature of said thermal mass.

23. A method as in claim 17, wherein said at least one measured value of said temperature parameter includes a rate of change of temperature of said thermal mass.

24. A method as in claim 17, wherein said heating value is a power input to said thermal mass.

25. A method as in claim 17, wherein said heating value is a set point temperature of said thermal mass.

26. A method as in claim 17, wherein said providing of said at least one characteristic parameter includes providing a plurality of temperature attributes comprising a mathematical model of at least one of said first and second wafers undergoing heating.

27. A method as in claim 17, wherein said adjusting of said heating value includes computing a predicted value of said steady state temperature from said at least one measured value.

28. A method as in claim 27, wherein said adjusting of said heating value includes computing a difference between said predicted value and said desired value of said steady state temperature, and said difference is used to adjust said heating value.

29. A method as in claim 17, wherein said step of adjusting said heating value is performed prior to heating of said second wafer and causes said second wafer to be heated to about said desired value of said steady state temperature.

30. A wafer heating device, comprising:
   a thermal mass for heating a wafer, said wafer having an initial heat;
   a temperature sensor that senses at least one temperature parameter of said thermal mass, said at least one temperature parameter being effected by said initial heat of said wafer; and
   a controller that controls a heating value of said thermal mass, said controller storing said at least one temperature parameter and at least one characteristic parameter describing said wafer undergoing heating;
   whereby said controller computes a desired heating value to achieve a desired value of a steady state temperature using at least said temperature parameter and said at least one characteristic parameter, and adjusts the heating value of said thermal mass to achieve said desired heating value.

31. A heating device as in claim 30, wherein said at least one characteristic parameter includes a plurality of temperature attributes comprising a mathematical model of said wafer undergoing heating.

32. A heating device as in claim 31, wherein said mathematical model includes an expected heating profile of said wafer over time.

33. A wafer heating device, comprising:
a thermal mass for heating a wafer, said thermal mass supporting said wafer during said heating;
a temperature sensor that senses at least one temperature parameter of said thermal mass; and
a controller that controls a heating value of said thermal mass, said controller comprising:
a processing unit; and
a storage unit connected to said processing unit that stores said at least one temperature parameter and at least one characteristic parameter describing said wafer undergoing heating;
whereby said processing unit computes a desired heating value to achieve a desired value of a steady state temperature using at least said temperature parameter and said at least one characteristic parameter, and said controller adjusts the heating value of said thermal mass to achieve said desired heating value.

34. A device as in claim 33, wherein said at least one characteristic parameter includes a heat absorption rate of said wafer.

35. A device as in claim 33, wherein said at least one characteristic parameter includes a heat emissivity of said wafer.

36. A device as in claim 33, wherein said at least one characteristic parameter is different for wafers having different structural configurations.

37. A device as in claim 33, wherein said at least one characteristic parameter is alike for all wafers having a same structural configuration.

38. A device as in claim 33, wherein said at least one temperature parameter includes a temperature of said thermal mass.

39. A device as in claim 33, wherein said at least one temperature parameter includes a rate of change of temperature of said thermal mass.

40. A device as in claim 33, wherein said heating value is a power input to said thermal mass.

41. A device as in claim 33, wherein said heating value is a set point temperature of said thermal mass.

42. A device as in claim 33, wherein said at least one characteristic parameter includes a plurality of temperature attributes comprising a mathematical model of said wafer undergoing heating.

43. A device as in claim 33, wherein said processing unit is configured to calculate a predicted value of said steady state temperature from said at least one temperature parameter.

44. A device as in claim 43, wherein said processing unit is configured to calculate a difference between said predicted value and said desired value of said steady state temperature, and said controller adjusts said heating value using said difference.

45. A device as in claim 33, wherein said controller is configured to adjust said heating value during heating of a first wafer to cause said first wafer to be heated to about said desired value of said steady state temperature.

46. A device as in claim 33, wherein said temperature sensor is configured to sense said at least one temperature parameter during heating of a first wafer, and said controller is configured to adjust said heating value prior to heating of a second wafer, permitting said second wafer to be heated to about said desired value of said steady state temperature.

* * * * *

UNITED STATES PATENT AND TRADEMARK OFFICE
CERTIFICATE OF CORRECTION

PATENT NO.    : 6,462,313 B1
DATED         : October 8, 2002
INVENTOR(S)   : Gurtej Sandhu It is certified that error appears in the above-identified patent and that said Letters Patent is hereby corrected as shown below:

Column 7,
Line 14, "DETAILED DESCRIPTION OF THE PREFERRED EMBODIMENTS" the word "eating" should be changed to -- heating. --

Signed and Sealed this

Fourth Day of February, 2003

JAMES E. ROGAN
*Director of the United States Patent and Trademark Office*